(12) United States Patent
Schöpf et al.

(10) Patent No.: US 6,242,987 B1
(45) Date of Patent: Jun. 5, 2001

(54) OSCILLATOR STRUCTURE HAVING RESONATOR DISPOSED BELOW OSCILLATOR CIRCUIT

(75) Inventors: Klaus-Jürgen Schöpf, Chandler, AZ (US); Gerhard Lohninger, München (DE); Lothar Musiol, Tempe, AZ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/613,034

(22) Filed: Jul. 10, 2000

Related U.S. Application Data

(63) Continuation of application No. PCT/DE98/03803, filed on Dec. 29, 1998.

(30) Foreign Application Priority Data

Jan. 8, 1998 (DE) .............................................. 198 00 459

(51) Int. Cl.⁷ .................................................... H03B 5/18
(52) U.S. Cl. .................. 331/96; 331/108 D; 331/117 D; 331/177 V
(58) Field of Search ........................... 331/96, 99, 108 C, 331/108 D, 117 R, 117 FE, 117 D, 177 V

(56) References Cited

U.S. PATENT DOCUMENTS

| | | | |
|---|---|---|---|
| 5,087,896 | * 2/1992 | Wen et al. | 331/108 D |
| 5,140,286 | 8/1992 | Black et al. | 331/99 |
| 5,227,739 | 7/1993 | Mandai et al. | 331/96 |
| 5,357,218 | 10/1994 | Wingfield et al. | 331/96 |

FOREIGN PATENT DOCUMENTS 26 13 119  9/1977 (DE) .

OTHER PUBLICATIONS

"Wide Tuning Range Si Bipolar VCO's Based on Three–Dimensional MMIC Technology"(Kamogawa et al.), dated Dec. 1997, IEEE Transactions on Microwave Theory and Techniques, vol. 45, No. 12, pp. 2436–2443.

"Internal Isolation Rings Improve VCO Performance" (Kaltenecker et al.), dated Aug. 1992, 8182 Motorola Technical Developments, Schaumburg, Illinois, US, vol. 16, p. 70.

* cited by examiner

*Primary Examiner*—Siegfried H. Grimm
(74) *Attorney, Agent, or Firm*—Herbert L. Lerner; Laurence A. Greenberg; Werner H. Stemer

(57) ABSTRACT

An oscillator structure includes at least one oscillator circuit and at least one resonator. The oscillator circuit is disposed on a support and the resonator is situated essentially within the support and/or is a constituent part of the support. The resonator is preferably formed by an electrical conductor and the oscillator circuit is preferably formed by an integrated electronic circuit.

14 Claims, 4 Drawing Sheets

OSCILLATOR STRUCTURE HAVING RESONATOR DISPOSED BELOW OSCILLATOR CIRCUIT

CROSS-REFERENCE TO RELATED APPLICATION

This application is a continuation of copending International Application No. PCT/DE98/03803, filed Dec. 29, 1998, which designated the United States.

BACKGROUND OF THE INVENTION

FIELD OF THE INVENTION

The invention relates to an oscillator structure having at least one oscillator circuit and at least one resonator.

Oscillators are electronic oscillation generators, i.e. circuits for producing electrical oscillations. The electrical oscillations generally have a sinusoidal waveform. However, a different waveform, for example in the form of a square, sawtooth, triangular or delta shape, is also possible. The oscillators contain an amplifier and at least one feedback device. An effect produced by the feedback device is that part of an output signal from the amplifier is fed back to its input.

A multiplicity of electronic devices contain an oscillator. Besides signal generators, function generators and pulse generators, transmitters and receivers in the radiofrequency to microwave range are of particular interest.

An oscillator structure of that generic type may, in particular, be a VCO (voltage controlled oscillator), which is stabilized by a resonator.

A special feature of a VCO is that its frequency can be controlled by a voltage applied to it. The oscillator is stabilized by using a resonator. VCOs are suitable both for logic circuits and for radiofrequency applications. When used in the radiofrequency range, an oscillatory response can be tuned by a varactor diode, for example. That allows the oscillator structure to be used in the gigahertz range.

The known oscillator structures have proved themselves in many different ways in practice. However, the large dimensions of the oscillator structure are a disadvantage.

SUMMARY OF THE INVENTION

It is accordingly an object of the invention to provide an oscillator structure having at least one oscillator circuit and at least one resonator, which overcomes the hereinafore-mentioned disadvantages of the heretofore-known devices of this general type, which takes up as little volume as possible and which can be integrated into a housing.

With the foregoing and other objects in view there is provided, in accordance with the invention, an oscillator structure, comprising a conductive support; at least one oscillator circuit disposed on the conductive support; and at least one resonator formed by an exposed electrical conductor disposed below the oscillator circuit.

Thus, the invention provides for the oscillator structure to be constructed in such a way that the oscillator circuit and the resonator are physically isolated from one another. This allows the oscillator circuit to have the smallest possible dimensions and, at the same time, means that a resonator of sufficient size for the necessary electrical properties can be produced.

A reduction in the space requirement for the oscillator structure is achieved by the resonator being situated within a support for the oscillator circuit and/or being a constituent part of that support.

The result of placing the oscillator circuit on a support which already contains the resonator is that the dimensions of the oscillator structure can be kept very small.

Whereas the resonator is made of an electrically conductive material, the support can be conductive or nonconductive. The term support should in no way be understood as being restrictive. In particular, it should be understood as meaning any mount or base for the oscillator circuit.

The support can also be formed by a film, for example. In this case, the conductor is expediently formed by a metalization layer applied to the film. Such a metalization layer can also be used if the support is made from a plastic or ceramic substrate.

The support may also be made from a metal and may be in the form of a punched sheet-metal strip (lead frame), for example.

The invention also refers, in particular, to the integration of the oscillator structure on the support in a housing, in particular as a component.

In this case, the support is disposed in a housing plane, preferably in a lower region of the housing. The oscillator circuit is situated on this support.

A further reduction in the necessary space can be achieved by the conductive support part situated below the oscillator circuit containing at least one electrical conductor.

In accordance with another feature of the invention, the electrical conductor has a strip shape. Other structures of the electrical conductor, such as a meander shape or a spiral shape, are also expedient, with the selected shape being matched to the frequency.

The construction of the electrical conductor as an exposed part of a conductive support, which is connected to the support at one end, has the particular advantage of permitting a part of the support surface which is below the oscillator circuit to be used directly for forming an electrical resonant circuit. In this case, in an electrical equivalent circuit diagram, the exposed conductor represents an inductor, defined by the mechanical dimensions of the conductor, with a resistor connected in parallel. Preferably, the electrical conductor is connected to a ground potential at one point. This is done, by way of example, through the support, which is preferably constructed as a support surface. At another point, the electrical conductor is electrically connected to a capacitance.

In accordance with a further feature of the invention, in order to improve the electrical properties further, one end of the preferably strip-shaped electrical conductor is disposed on the support, and the other end of the electrical conductor is used as a coupling point for inputting or outputting an electrical signal.

In accordance with an added feature of the invention, the electrical conductor is situated essentially within a conductive support surface. Such a configuration has the advantage of reducing the influence of external interference fields to a large extent.

In accordance with an additional feature of the invention, a further reduction in the space requirement can be achieved if the oscillator circuit is formed by an integrated electronic circuit.

In accordance with yet another feature of the invention, the integrated electronic circuit contains at least one varactor diode.

A varactor diode is a surface-contact diode with a pn junction at which a depletion layer is formed that can be varied by using a control voltage in the reverse direction. The insulating depletion layer forms a capacitor with the conductive covering surfaces. The capacitor has a surface which remains constant and a plate spacing that can be changed by using the control voltage. A varactor diode is preferably distinguished by a large ratio between the largest and the smallest useful capacitance, a low series resistance and therefore a high quality. Due to the use of a varactor diode device, the integrated electronic circuit contains a voltage-controlled, variable capacitor. This controls the natural frequency of the resonator.

The varactor diode can be formed from various basic materials. Besides silicon, which is particularly easy to handle in technological terms, gallium arsenide is particularly suitable for high frequencies. With gallium arsenide, the mobility of the charge carriers is approximately four times greater than in silicon and the series resistance of the varactor diode is correspondingly lower.

In accordance with yet a further feature of the invention, there is provided an amplifier for exciting the electrical oscillation. The amplifier can be disposed at any desired point, but it is a particularly expedient feature that the amplifier is incorporated into the integrated electronic circuit.

In accordance with yet an added feature of the invention, the amplifier is incorporated together with the varactor diode.

In principle, the oscillator circuit, which is preferably formed by an integrated electronic circuit, may be mechanically connected to the support in any desired manner. However, in accordance with yet an additional feature of the invention, the integrated electronic circuit is connected to the support through the use of an adhesive layer. A connection using an adhesive layer has a number of advantages. Such a connection is very simple to produce. Furthermore, it is possible for the adhesive layer to insulate the integrated electronic circuit from a support and/or a resonator. The connection using an adhesive layer is particularly expedient if the electronic circuit is in the form of a chip. The chip then advantageously has no metalization on the back.

In accordance with again another feature of the invention, the integrated electronic circuit is connected to the preferably conductive support through the use of a connecting wire (bonding wire).

In accordance with a concomitant feature of the invention, there is provided a connecting wire connected to the coupling point of the exposed electrical conductor.

Other features which are considered as characteristic for the invention are set forth in the appended claims.

Although the invention is illustrated and described herein as embodied in an oscillator structure having at least one oscillator circuit and at least one resonator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings in detail, there is seen an illustration which relates to an exemplary embodiment of an oscillator structure according to the invention in a commercially available IC housing, such as a housing having an SCT596 structure.

Figure 1:
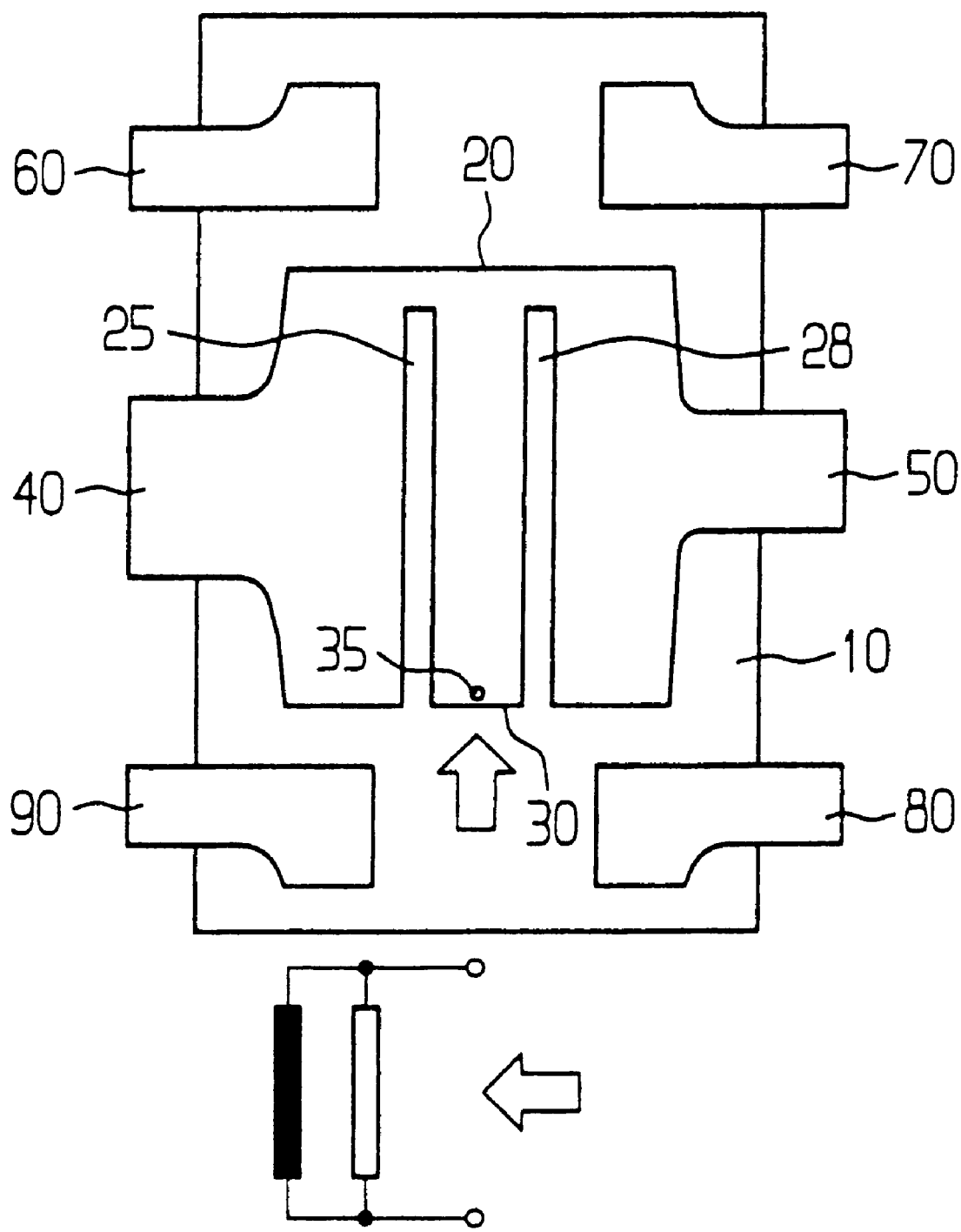
FIG. 1 contains both a diagrammatic plan view of a housing having a support which contains an exposed electrical conductor, as well as a diagram of an electrical equivalent circuit.
Figure 2:
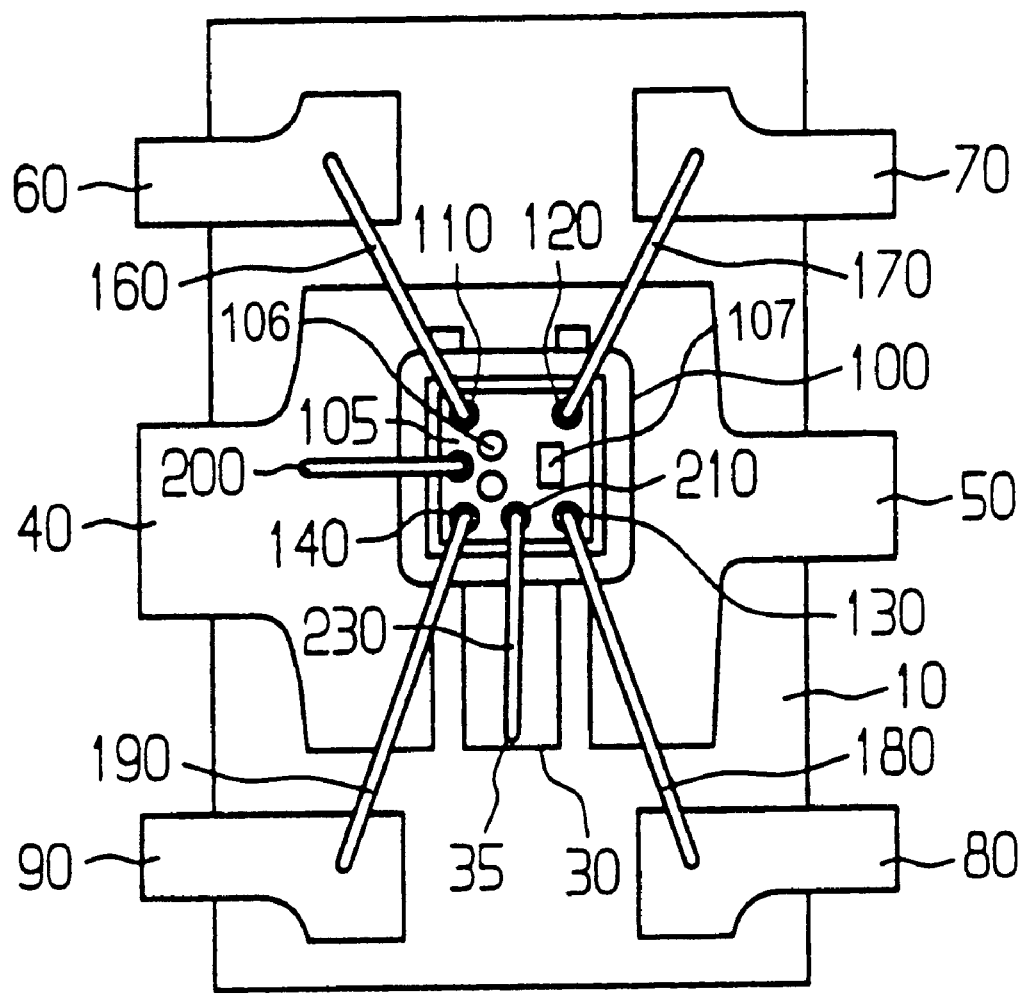
FIG. 2 is a view similar to FIG. 1 with an oscillator formed by an integrated electronic circuit.

FIGS. 1 and 2 show how a support 20, which is preferably a punched sheet-metal strip (lead frame), and further connections 60, 70, 80 and 90, which are preferably made of metal, are situated in a housing 10. The surface area of the support 20 is on the order of magnitude of 1 mm$^2$.

The housing 10 is preferably made of a molded plastic based on epoxy resin having a dielectric constant in a range of from 3 to 5.

Figure 3:
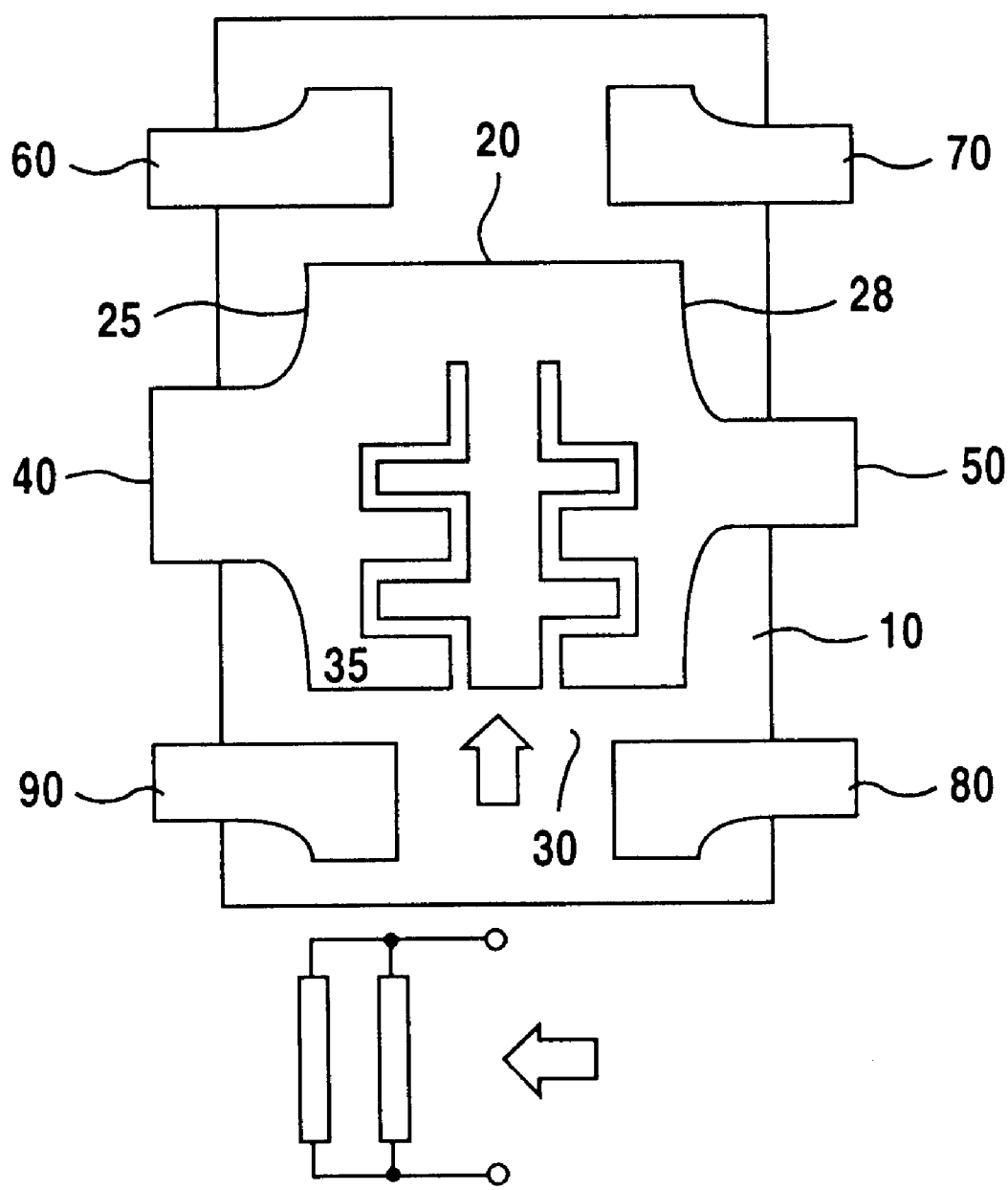
FIGS. 3 and 4 are views similar to FIG. 1 respectively showing meander and spiral-shaped conductors.
Figure 4:
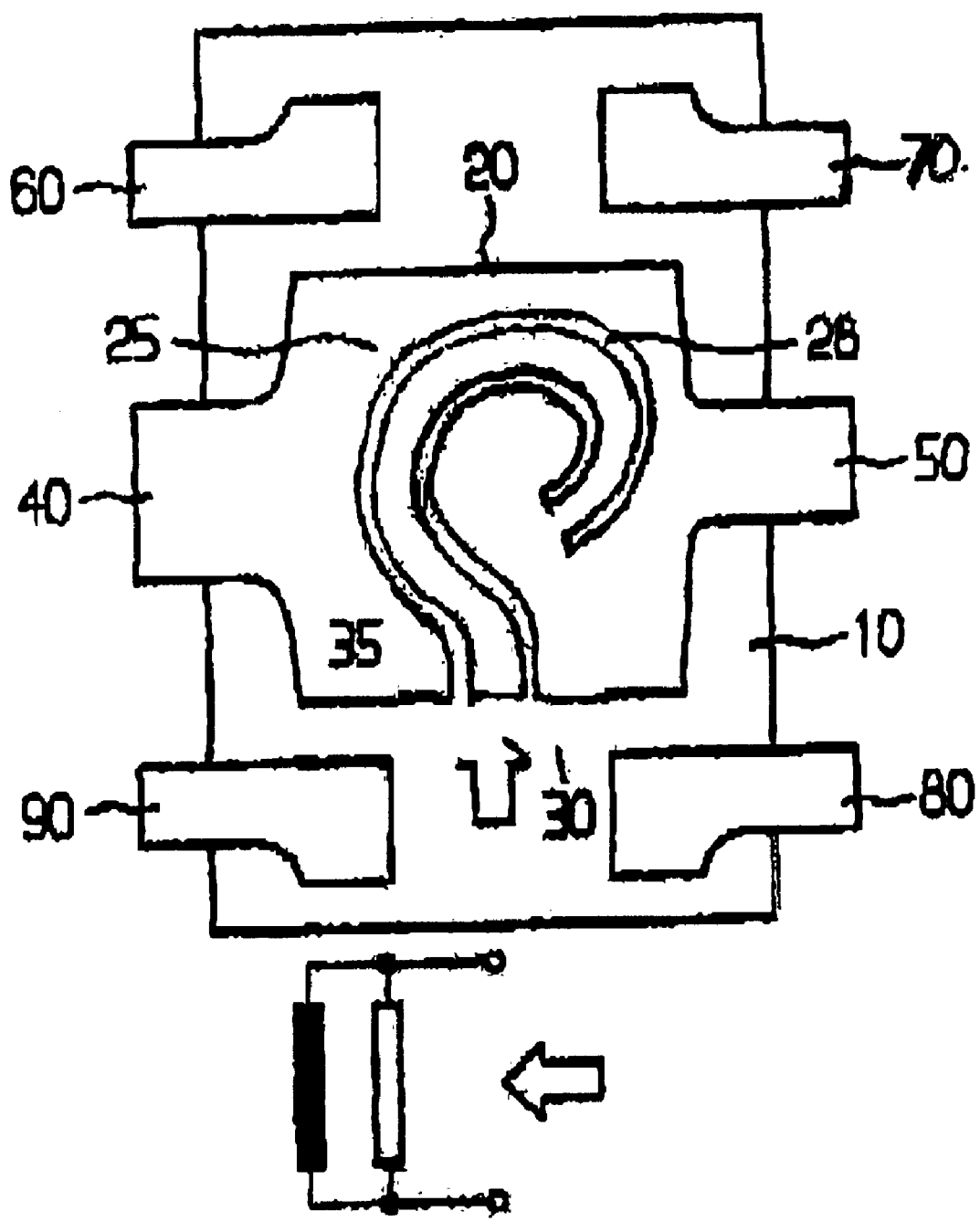

The metal part referred to as the support 20 and the connections 60, 70, 80 and 90, which likewise have an areal construction, are preferably a lead frame for a semiconductor assembly from which the structures described herein are punched. The support 20 has cutouts 25 and 28 between which an electrical conductor 30 having a tongue-like construction is exposed. The electrical conductor 30 may also be referred to as a conductor strip in this case. The electrical conductor 30 preferably has a length on the order of magnitude of 1 mm. By way of example, the dimensions of the electrical conductor 30 are: 800 $\mu$m×250 $\mu$m. The electrical conductor 30 may also have a meander or spiral shape as is respectively shown in FIGS. 3 and 4.

One end of the electrical conductor 30 is in contact with the support 20. An opposite end of the electrical conductor 30, in a region of a coupling point 35, has an apparatus for inputting or outputting an electrical signal.

The planar support 20 has a side region which contains contacts 40 and 50 used for connecting a ground potential. The contacts 40 and 50 are likewise in the plane of the main surface of the support 20, but perpendicular to the electrical conductor 30. The contacts 40 and 50 are constructed differently in order to obtain an identification which prevents rotation through 180°. However, both contacts 40, 50 are soldered to ground in the same way.

A resonant frequency of the electrical conductor 30 acting as a resonator results from a length of the electrical conductor 30 and a dielectric constant of the housing. The dielectric constant of the housing is in a range from 2 to 6, with 4 being a usual value.

The connections 60, 70, 80 and 90 enable a supply voltage and an oscillator control voltage, a so-called VCO tuning voltage, to be applied and they enable a signal output and connection options for external circuit elements to be created. It is expedient for a grounding capacitor to be connected, in order to block out interference influences.

FIG. 1 also contains an electrical equivalent circuit diagram, in which the exposed conductor represents an inductor, defined by the mechanical dimensions of the conductor, with a resistor connected in parallel.

FIG. 2 is used below to explain how the support structure illustrated and discussed above with the aid of FIG. 1 is completed by adding an integrated electrical circuit to produce an oscillator structure.

An integrated electronic circuit 105 is connected to the support 20 through the use of an insulating adhesive layer 100. Selected regions ("bonding pads") 110, 120, 130 and 140 of the integrated electronic circuit 105 are connected to the connections 60, 70, 80 and 90 through connecting wires 160, 170, 180 and 190. This allows a supply voltage or an oscillator control voltage to be applied to the selected regions 110, 120, 130 and 140 of the integrated electronic circuit 105. In addition, connection options for external circuit elements are created in this way. The integrated electronic circuit 105 may contain at least one varactor diode 106 which interacts with the resonator in an electrical resonant circuit. The integrated electronic circuit 105 may also contain at least one amplifier 107.

A further connecting wire 200 is used to connect the integrated electronic circuit 105 directly to the contact 40 for the support plate 20 and therefore to the ground potential.

Another selected region 210 of the integrated electronic circuit 105 is connected through the use of a connecting wire 230 to the coupling point 35 disposed at the free end of the electrical conductor 30.

The oscillator structure described above combines the advantages of integrability into a housing, preferably a plastic housing, with superb electrical properties, such as a tunable capacitance and as little influencing as possible by external interference fields.

This construction of the oscillator structure according to the invention is particularly advantageous. However, it is likewise possible to construct the oscillator structure in a different way, so that the oscillator structure is integrated, by way of example, directly on a printed circuit board or film, on a hybrid substrate or in a microsystem.

We claim:

1. An oscillator structure, comprising:
   a conductive support;
   at least one oscillator circuit disposed on said conductive support; and
   at least one resonator formed by an exposed electrical conductor disposed below said oscillator circuit.

2. The oscillator structure according to claim 1, wherein said support is a support surface, and said electrical conductor is disposed substantially within said support surface.

3. The oscillator structure according to claim 1, wherein said electrical conductor has one end connected to said support and another end used as a coupling point for inputting or outputting an electrical signal.

4. The oscillator structure according to claim 1, wherein said electrical conductor has a strip shape.

5. The oscillator structure according to claim 1, wherein said electrical conductor has a meander shape.

6. The oscillator structure according to claim 1, wherein said electrical conductor has a spiral shape.

7. The oscillator structure according to claim 1, wherein said at least one oscillator circuit is formed by an integrated electronic circuit.

8. The oscillator structure according to claim 7, wherein said integrated electronic circuit contains at least one varactor diode.

9. The oscillator structure according to claim 8, wherein said varactor diode interacts with said at least one resonator in an electrical resonant circuit.

10. The oscillator structure according to claim 1, wherein said at least one oscillator circuit contains at least one amplifier.

11. The oscillator structure according to claim 1, including an adhesive layer connecting said at least one oscillator circuit to said support.

12. The oscillator structure according to claim 11, wherein said adhesive layer insulates said at least one oscillator circuit from said support.

13. The oscillator structure according to claim 1, including at least one connecting wire connecting said at least one oscillator circuit to said support.

14. The oscillator structure according to claim 13, wherein said support has a coupling point for inputting or outputting an electrical signal, and said at least one connecting wire is connected to said coupling point.

* * * * *